United States Patent [19]

Asano et al.

[11] Patent Number: 4,612,462

[45] Date of Patent: Sep. 16, 1986

[54] LOGIC CIRCUIT HAVING VOLTAGE BOOSTER

[75] Inventors: Masamichi Asano, Tokyo; Hiroshi Iwahashi, Yokohama, both of Japan

[73] Assignee: Tokyo Shibaura Denki Kabushiki Kaisha, Kawasaki, Japan

[21] Appl. No.: 487,024

[22] Filed: Apr. 21, 1983

[30] Foreign Application Priority Data

Apr. 24, 1982 [JP] Japan ................................. 57-68921

[51] Int. Cl.[4] ................ H03K 19/003; H03K 19/017; H03K 19/094; H03K 17/10
[52] U.S. Cl. ............................... 307/482; 307/200 B; 307/443; 307/450; 307/578; 307/264
[58] Field of Search ................... 307/200 B, 443, 449, 307/450, 482, 578, 270, 264, 296 R, 296 A; 365/226, 228

[56] References Cited

U.S. PATENT DOCUMENTS

| | | | |
|---|---|---|---|
| 4,061,933 | 12/1977 | Schroeder et al. | 307/262 |
| 4,071,783 | 1/1978 | Knepper | 307/482 X |
| 4,087,704 | 5/1978 | Mehta et al. | 307/449 X |
| 4,284,905 | 8/1981 | Rosenzweig | 307/482 |
| 4,330,719 | 5/1982 | Nagami | 307/578 X |
| 4,352,996 | 10/1982 | White, Jr. | 307/578 X |
| 4,354,123 | 10/1982 | Eaton, Jr. | 307/482 X |
| 4,382,194 | 5/1983 | Nakano et al. | 307/578 X |
| 4,449,066 | 5/1984 | Aoyama et al. | 307/482 |
| 4,494,015 | 1/1985 | Frieling et al. | 307/482 X |
| 4,500,799 | 2/1985 | Sud et al. | 307/482 X |

FOREIGN PATENT DOCUMENTS

| | | |
|---|---|---|
| 0023847 | 2/1981 | European Pat. Off. |
| 0035408 | 9/1981 | European Pat. Off. |
| 0045133 | 2/1982 | European Pat. Off. |
| 2920966 | 11/1979 | Fed. Rep. of Germany |
| 8201795 | 5/1982 | Int'l Pat. Institute |
| 57-74885 | 5/1982 | Japan |

OTHER PUBLICATIONS

Joynson et al., "Eliminating Threshold Losses in MOS Circuits by Bootstrapping Using Varactor Coupling", IEEE Journal of Solid-State Circuits, vol. SC-7, No. 3, pp. 217-224, Jun. 1972.
Patent Abstracts of Japan, vol. 6, No. 222, Nov. 6, 1982.
Patent Abstracts of Japan, vol. 5, No. 185, Nov. 25, 1981.
Electronics, p. 123, Feb. 10, 1982.

*Primary Examiner*—Larry N. Anagnos
*Attorney, Agent, or Firm*—Finnegan, Henderson, Farabow, Garrett & Dunner

[57] ABSTRACT

When an input signal to be supplied to a signal input end becomes high, a voltage corresponding to the signal of logic level "1" is boosted by a voltage booster, and a boosted voltage appears at a signal output end. During this operation, a switching circuit connected to the signal output end is operated to produce a steady voltage from a voltage boosted to a predetermined voltage higher than a power source voltage, thereby supplying the steady boosted voltage at the signal output end through the switching circuit.

21 Claims, 27 Drawing Figures

F I G. 20A
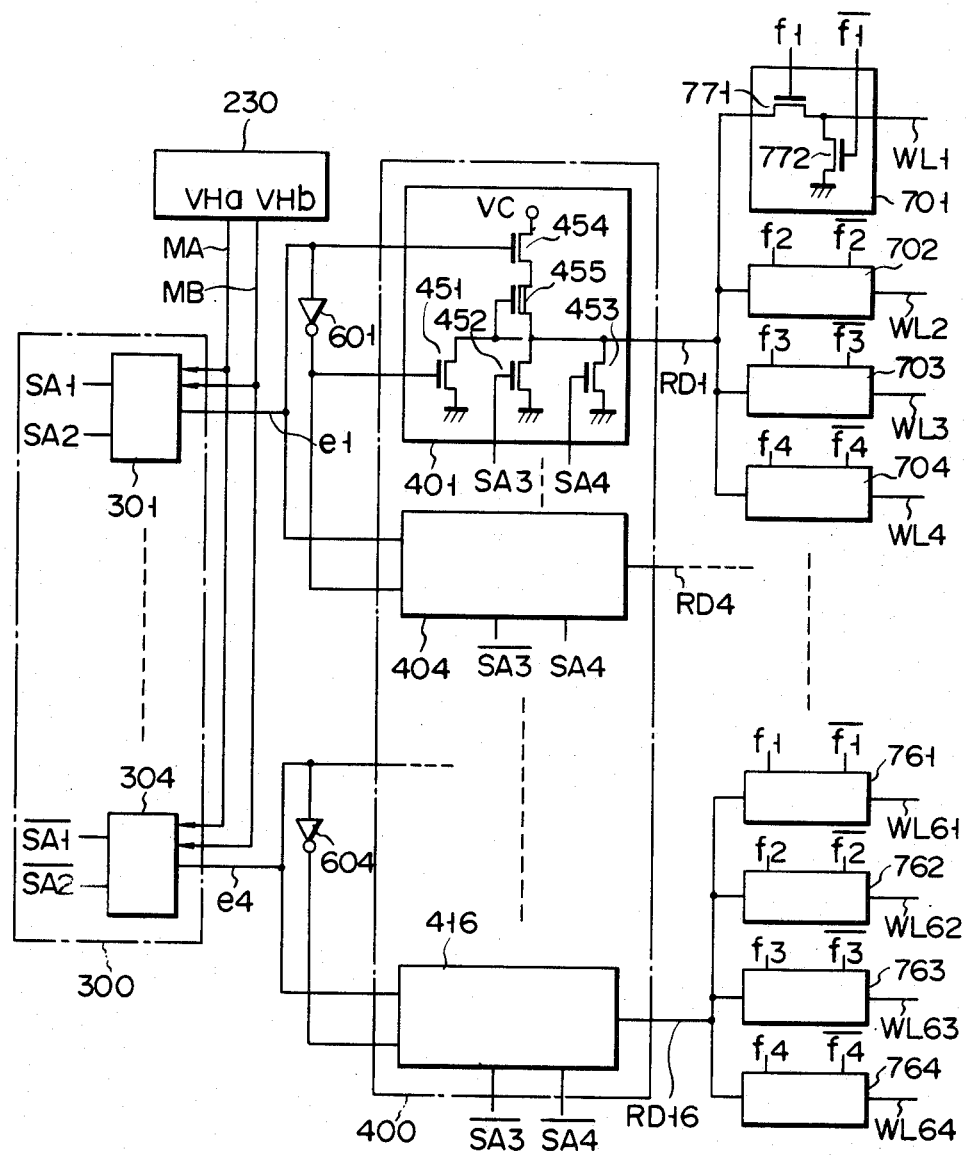

4,612,462

LOGIC CIRCUIT HAVING VOLTAGE BOOSTER

BACKGROUND OF THE INVENTION

The present invention relates to a logic circuit of MOS transistors and, more particularly, to a logic circuit having a voltage booster.

Conventionally, a logic circuit having a voltage booster in an output stage thereof has been adopted to improve the efficiency of data transfer and to decrease power consumption in the field of semiconductor memories such as a RAM (random access memory) which allows data read/write operations and a ROM (read-only memory) which allows only data read operations. In the logic circuit of the type described above, an output buffer at the output stage of the logic circuit comprises an enhancement-type MOS transistor. A switching input signal to be supplied to the gate of this MOS transistor is boosted by a voltage booster arranged at the same output stage. The boosted voltage is then supplied to the gate of the MOS transistor so as to keep a voltage level of an output signal of logic level "1" from the output buffer coincident with the power source voltage level. However, in a conventional logic circuit, no means is provided to stably maintain the boosted voltage obtained from the voltage booster. A leakage current occurs at a p-n junction connected to the output end of the voltage booster. The boosted voltage becomes equal to or lower than the power source voltage over a predetermined period of time.

FIGS. 1A to 1C, respectively, show conventional circuits of the type described above. FIG. 1A shows a general logic circuit for boosting an input signal so as to obtain a boosted output signal. In this circuit, a decoder output signal or a predetermined logic signal is supplied to an input end (signal input end) A of an input buffer circuit 11. An output signal appearing at the output end B of the input buffer circuit 11 is supplied to a series circuit of inverters 12 and 13 and a capacitor 14. When the signal at the input end A goes from logic level "0" to logic level "1", a signal which becomes high appears at the output end B of the input buffer circuit 11. The output signal of logic level "1" is delayed by the inverters 12 and 13 (i.e., the signal of logic level "1" is inverted twice). The inverter 13 then generates an output signal of logic level "1", and this signal of logic level "1" is boosted through the capacitor 14 and appears at the output end B. The boosted voltage signal appearing at the output end B is supplied to the gate of a switching transistor (i.e., a row line of a semiconductor memory).

FIG. 1B shows another conventional circuit. This circuit comprises a delay circuit 20 and a voltage booster 30. The delay circuit 20 comprises n-channel (all transistors referred to hereinafter are of n-channel type) MOS transistors 21 to 24. A series circuit of the MOS transistors 21 and 22 is connected between a positive power source voltage VC and the ground potential. A series circuit of the MOS transistors 23 and 24 is also connected between the positive power source voltage VC and the ground potential. A node C of the MOS transistors 21 and 22 is connected to the gate of the MOS transistor 24. An input signal φ1 is supplied to the gate of the MOS transistor 21. A signal φp is supplied to the gates of the MOS transistors 22 and 23. A node between the MOS transistors 23 and 24 corresponds to an end D.

The voltage booster 30 comprises five MOS transistors 31 to 35 and a capacitor 36. A series circuit of the MOS transistors 31 and 32 is connected between a signal (φ1) applying point and the ground potential. The MOS transistor 33 is connected between the end D and an end E connected to the gate of the MOS transistor 31. A series circuit of the MOS transistors 34 and 35 is connected between a power source voltage VC and the ground potential. The capacitor 36 is connected between a node F of the MOS transistors 34 and 35 and the gate of the MOS transistor 34. A node G of the series circuit of the MOS transistors 31 and 32 is connected to the gate of the MOS transistor 34. The end D is connected to the gate of the transistor 35. A signal φp is supplied to the gate of the MOS transistor 32. The power source voltage VC is applied to the gate of the MOS transistor 33. In this circuit, when the signals φp and φ1 are set to logic levels "1" and "0", respectively, the ends C, D, and E and the nodes F and G are set to logic levels "0", "1", "1", "0" and "0", respectively. When the input signal φ1 becomes logic level "1" after the signal φp becomes logic level "0", the node G is set to logic level "1" in response to the input signal φ1 through the MOS transistor 31. In this condition, since the end D is kept at logic level "1", the node F is kept at logic level "0". The signal φ1 is delayed by the delay circuit 20 and is supplied through the end D, so that the end D becomes logic level "0". The end E becomes logic level "0" through the MOS transistor 33. Then, the MOS transistor 31 is turned off. At the same time the MOS transistor 35 is turned off. The node F is then set to logic level "1". A voltage appearing at the node G is boosted by the capacitor 36.

FIG. 1C shows still another conventional circuit 40. The circuit 40 is frequently coupled to a decoder or the like and comprises four enhancement-type MOS transistors 41 to 44, a depletion-type MOS transistor 45 and a capacitor 46. The MOS transistor 41 is connected between ends I and J. The end I receives an output signal from a decoder 50. A series circuit of the MOS transistors 45 and 42 is connected between a positive power source voltage VC and the ground potential. The gate of the MOS transistor 45 used as a load element is connected to a node K between the MOS transistors 45 and 42. The gate of the MOS transistor 42 is connected to the end I. A series circuit of the MOS transistors 43 and 44 is connected between the power source voltage VC and the ground potential. The gate of the MOS transistor 43 is connected to the end J. The gate of the MOS transistor 44 is connected to the node K. The capacitor 46 is connected between a node L of the MOS transistors 43 and 44 and the gate of the MOS transistor 43. In this circuit, an E/D inverter 47 is constituted by the enhancement-type MOS transistor 42 and the depletion-type MOS transistor 45. When the signal at the end I from the decoder 50 becomes logic level "1", a signal of logic level "1" is supplied to the end J through the MOS transistor 41. In this condition, however, the node K is kept at logic level "1", the MOS transistor 44 is turned on, and the end L is still kept at logic level "0". When the signal of logic level "1" is then delayed and inverted by the inverter 47 (i.e., the node K becomes logic level "0"), the end L is set to logic level "1". A voltage signal at the end J is boosted by the capacitor 46. In this condition, the MOS transistor 41 is turned off. Thereafter, the MOS transistor 43 is operated in the same manner as that of a triode, and a voltage corresponding to the power source voltage VC appears at the end L. The end L is connected to a row line of a semiconductor memory (not shown).

In the circuits shown in FIGS. 1A to 1C, however, boosted voltages appearing at the ends B, G and J, respectively, decrease over a predetermined period of time due to leakage currents at the p-n junctions equivalently connected to the voltage booster. The boosted voltages obtained cannot then be used for proper operation, which is highly inconvenient.

SUMMARY OF THE INVENTION

It is, therefore, an object of the present invention to provide a logic circuit for preventing a decrease in a boosted voltage due to a leakage current.

According to an aspect of the present invention, there is provided a logic circuit comprising: a signal input end; a signal output end; voltage boosting means for boosting an input signal supplied to said signal input end when a voltage level of the input signal is changed to a predetermined level, thereby supplying a boosted input signal to said signal output end; voltage retaining means having an output end for steadily producing the boosted voltage higher than a power source voltage; and switching means arranged between said output end of said boosted voltage retaining means and said signal output end.

According to another aspect of the present invention, there is provided a logic circuit comprising: a signal input end; a signal output end; an internal boosted voltage end at which an internal voltage is obtained; boosted voltage retaining means having first and second output ends for steadily producing first and second boosted voltages boosted higher than a power source voltage, respectively; switching means arranged between the first output end of said boosted voltage retaining means and said internal boosted voltage end; and voltage boosting means having at least an MOS transistor, a drain of which is connected to said second output end of said voltage retaining means, a source of which is connected to said signal output end, and a gate of which is connected to said internal boosted voltage end, said voltage boosting means supplying to said internal boosted voltage end the internal boosted voltage obtained by boosting a voltage of an input signal to a voltage higher than the power source voltage when a voltage level of the input signal supplied to said signal input end is changed to a predetermined level, and supplying to said signal output end the second boosted voltage from said second output end of said voltage retaining means through said MOS transistor when the internal boosted voltage is supplied to said internal boosted voltage end.

BRIEF DESCRIPTION OF THE DRAWINGS

FIGS. 20A and 20B are circuit diagrams showing address decoders using the circuit in FIG. 19A.

DETAILED DESCRIPTION OF THE PREFERRED EMBODIMENTS

Figure 1A:
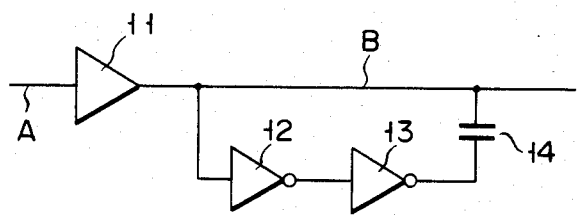
FIGS. 1A to 1C are circuit diagrams of conventional logic circuits having voltage boosters.
Figure 2:
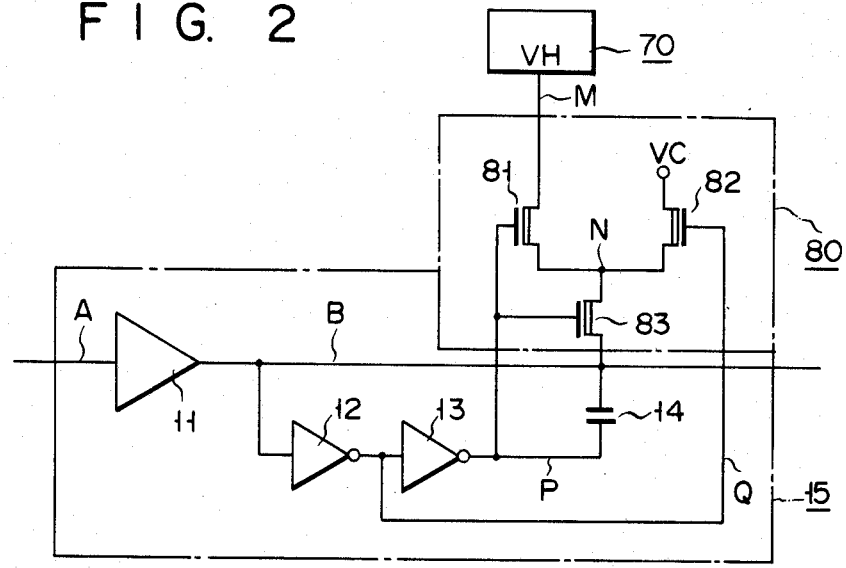
FIG. 2 is a circuit diagram of a logic circuit according to a first embodiment of the present invention.

FIG. 2 shows a logic circuit according to a first embodiment of the present invention. This circuit is arranged by improving a conventional circuit shown in FIG. 1A, and the same reference numerals as used in FIG. 1A denote the same parts in FIG. 2. Referring to FIG. 2, a voltage booster 15 comprises a buffer circuit 11, inverters 12 and 13, and a capacitor 14. A boosted voltage retention circuit 70 and a switching circuit 80 are arranged in the logic circuit. The boosted voltage retention circuit 70 has an output end M for steadily producing an auxiliary voltage VH boosted higher than a positive power source voltage VC (e.g., 5V). The switching circuit 80 has three depletion-type MOS transistors 81, 82 and 83. The drain of the MOS transistor 81 is connected to the end M, the source thereof is connected to an end N, and the gate thereof is connected to an output end P of the inverter 13. The drain of the MOS transistor 82 is connected to the positive power source voltage VC, the source thereof is connected to the end N, and the gate thereof is connected to an output end Q of the inverter 12. The drain of the MOS transistor 83 is connected to the end N, the source thereof is connected to the end B, and the gate thereof is connected to the end P. A transconductance gm of the MOS transistor 82 is sufficiently greater than that of the MOS transistor 83. The input end A of the input buffer circuit 11 is used as a signal input end. The output end B of the input buffer circuit 11 is used as a signal output end.

In this embodiment, when an input signal is set at logic level "0" (i.e., when the input end A is set at logic level "0"), the ends B and P are set at logic level "0", whereas the end Q is set at logic level "1". In this condition, since the transconductance gm of the MOS transistor 82 is sufficiently greater than that of the MOS transistor 83, a voltage at the end N is substantially the same as the power source voltage VC. In this circuit, when the input signal is set at logic level "0", an output signal is also set at logic level "0". When a threshold voltage of the MOS transistor 81 is defined as Vth81, a condition VG81−Vth81 < VS81 must be satisfied to turn off the MOS transistor 81 (where VG81 is the gate voltage of the MOS transistor 81, and VS81 is the source voltage thereof). If the MOS transistor 81 has a general threshold voltage (e.g., −3 V) of a depletion-type transistor, the gate voltage VG81 thereof is 0V and the source voltage VS81 thereof is about 5 V. Therefore, the above condition is satisfied. When the input signal is set at logic level "0", the MOS transistor 81 is turned off. As a result, the boosted voltage VH appearing at the output end M of the boosted voltage retention circuit 70 through the MOS transistor 81 may not decrease.

However, when the input signal becomes to logic level "1" (i.e., when the end B becomes logic level "1"), the end Q which receives the output signal from the inverter 12 is set to logic level "0" a short period of time after the end B goes to logic level "1". Then, the MOS transistor 82 is turned off. The end P which receives the output signal from the inverter 13 is set to logic level "1" a short period of time after the end Q becomes logic level "0". When the end P is set to logic level "1", the signal of logic level "1" at the signal output end B is boosted by the capacitor 14. At the same time, the MOS transistor 81 is turned on, and the boosted voltage VH from the output end M of the boosted voltage retention circuit 70 appears at the signal output end B through a series circuit of the MOS transistors 81 and 83. Since the end M serves to steadily supply the auxilary voltage VH, the steady boosted voltage can be obtained at the end B if a compensation function allows compensation for a leakage current at the p-n junction. In other words, when the input signal becomes logic level "1", the output signal is retained as a signal of logic level "1" which has a voltage higher than the power source voltage VC. In this circuit, the current supply capacity of the boosted voltage retention circuit 70 is very small. However, when the input signal is set to logic level "0" (i.e., when the end A is set at logic level "0"), the MOS transistor 81 is turned off, so that the boosted voltage VH at the output end M of the boosted voltage retention circuit 70 may not be lowered.

Figure 1B:
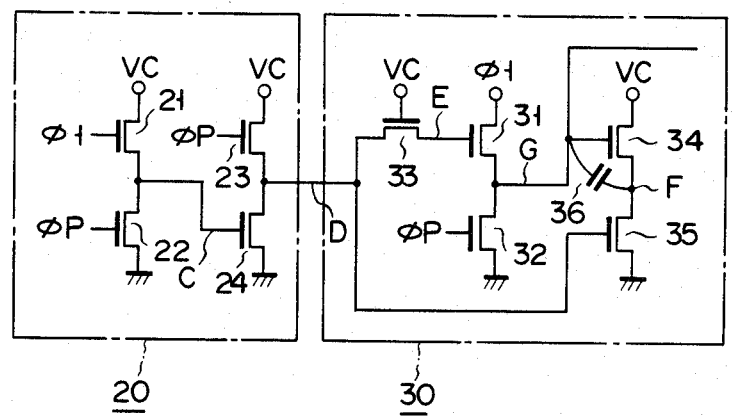
Figure 3:
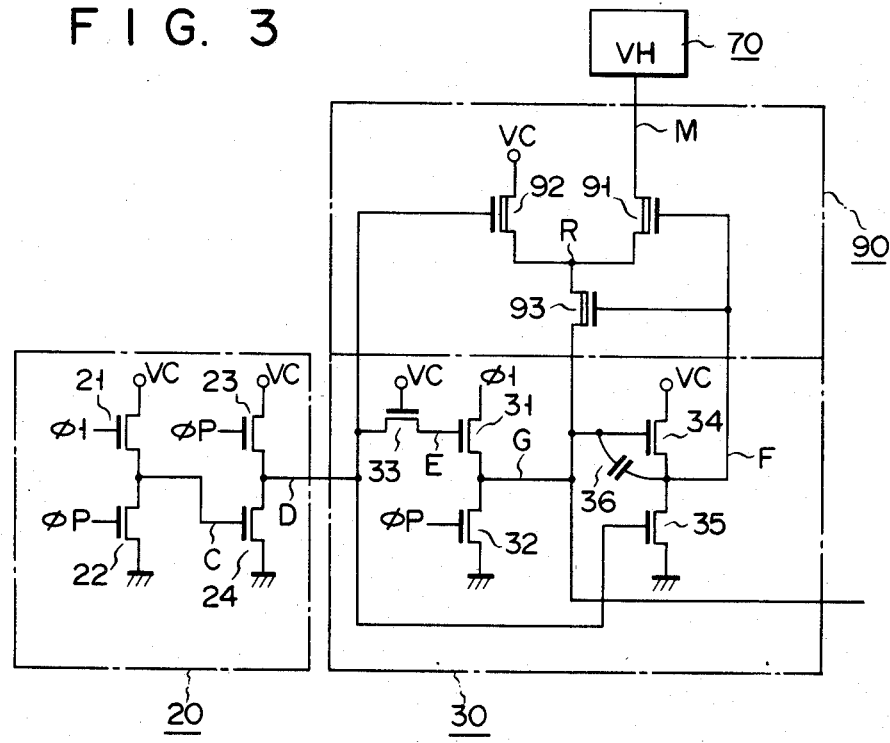
FIG. 3 is a circuit diagram of a logic circuit according to a second embodiment of the present invention.

FIG. 3 shows a logic circuit according to a second embodiment of the present invention. This circuit is obtained by improving a conventional circuit shown in FIG. 1B, and the same reference numerals as used in FIG. 1B denote the same parts in FIG. 3. The circuit according to the second embodiment is provided with a switching circuit 90 and a boosted voltage retaining circuit 70 having an output end M for steadily producing a boosted voltage VH boosted higher than a positive power source voltage VC (e.g., 5 V), in addition to a delay circuit 20 and a voltage booster 30. The switching circuit 90 has three depletion-type MOS transistors 91, 92 and 93. The drain of the MOS transistor 91 is connected to the end M, the source thereof is connected to an end R, and the gate thereof is connected to an end F of the voltage booster 30. The drain of the MOS transistor 92 is connected to the positive power source voltage VC, the source thereof is connected to the end R, and the gate thereof is connected to an end D of the delay circuit 20. The drain of the MOS transistor 93 is connected to the end R, the source thereof is connected to an end G of the voltage booster 30, and the gate thereof is connected to the end F. A transconductance gm of the MOS transistor 92 is preset to be sufficiently greater than that of the MOS transistor 93. In this circuit, the gate of the MOS transistor 21 and one end of the MOS transistor 31 serve as signal input ends of a signal $\phi 1$, respectively. The end G of the voltage booster 30 is used as a signal output end.

In the circuit described above, when a signal $\phi p$ is set at logic level "1" and the signal $\phi 1$ is set at logic level "0", the end D is set at logic level "1" by the delay circuit 20. The MOS transistor 35 in the voltage booster 30 is then turned on, so that the end F is set by the MOS transistor 35 to logic level "0". As the signal $\phi p$ is set at logic level "1", the MOS transistor 32 in the voltage booster 30 is turned on. The transistor 32 then allows the end G to be set to logic level "0". When the end D is set to logic level "1", the MOS transistor 92 in the switching circuit 90 is turned on. Since the transconductance gm of the MOS transistor 92 is preset to be sufficiently greater than that of the MOS transistor 93, a voltage which is substantially the same as the power source voltage appears at an end R. This causes the MOS transistor 91 to be turned off. Therefore, when the input signal $\phi 1$ is set at logic level "0", the output signal at the end G is also set at logic level "0". When the end G is set at logic level "0", the MOS transistor 91 is turned off. The boosted voltage VH at the output end M of the boosted voltage retention circuit 70 may not be lowered through the MOS transistor 91.

When the signal $\phi p$ becomes logic level "0" and the signal $\phi 1$ becomes logic level "1", a signal of logic level "1" appears at the end G through the MOS transistor 31. Thereafter, when the end D is set to logic level "0" by a delayed signal of logic level "0" from the delay circuit 20, the signal of logic level "0" from the MOS transistor 33 appears at the end E. The MOS transistor 31 is then turned off. At the same time, the MOS transistor 35 is turned off. Therefore, since the end G is set at logic level "1", the MOS transistor 34 is turned on to supply a signal of logic level "1" to the end F. In this condition, the voltage signal of logic level "1" at the signal output end G is boosted. At the same time, the MOS transistor 91 is turned on, and the boosted voltage VH at the output end M of the boosted voltage retention circuit 70 is supplied to the signal output end G through the series circuit of the MOS transistors 91 and 93. In short, when the input signal $\phi 1$ becomes logic level "1", the voltage signal of logic level "1" as a boosted output voltage is stably obtained at the signal output end.

Figure 1C:
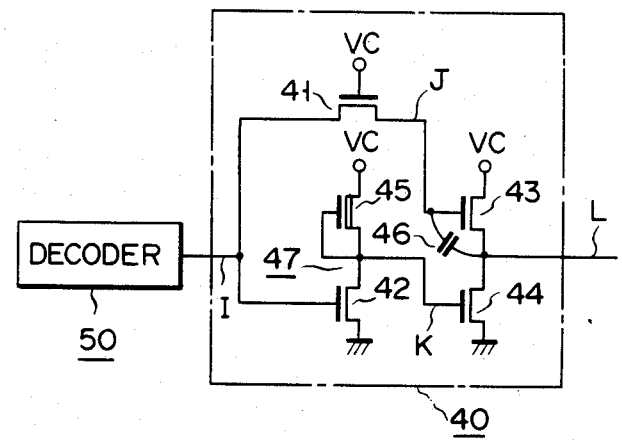
Figure 4:
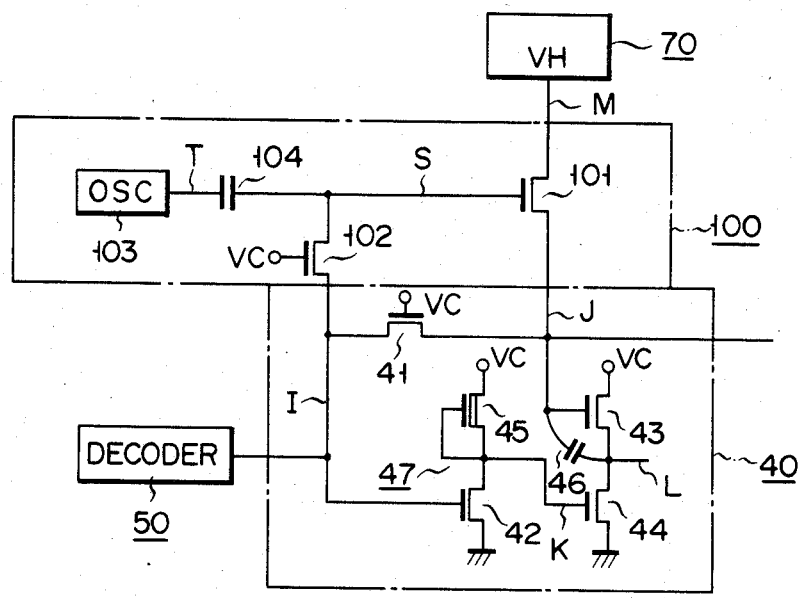
FIG. 4 is a circuit diagram of a logic circuit according to a third embodiment of the present invention.

FIG. 4 is a circuit diagram of a logic circuit according to a third embodiment of the present invention. This circuit is an improvement over the conventional circuit shown in FIG. 1C, and the same reference numerals as used in FIG. 1C denote the same parts in FIG. 4. The circuit according to this embodiment includes a voltage booster 40 which comprises MOS transistors 41 to 45 and a capacitor 46. In addition to this, the logic circuit has a switching circuit 100 and a boosted voltage retention circuit 70 which has an output end M for steadily producing a boosted voltage boosted higher than a power source voltage VC. The switching circuit 100 has two enhancement-type MOS transistors 101 and 102, an oscillator (OSC) 103 and a capacitor 104. The drain of the MOS transistor 101 is connected to the end M, the source thereof is connected to an end J of the voltage booster 40, and the gate thereof is connected to an end S. The oscillator 103 continuously oscillates a pulse signal having a predetermined pulse width. The pulse signal also has an amplitude the same as that of the power source voltage VC. One end of the capacitor 104 is connected to an output end T of the oscillator 103. The other end of the capacitor 104 is connected to the end S. The drain of the MOS transistor 102 is connected to an end I of the voltage booster 40, the source thereof is connected to the end S of the switching circuit 100, and the gate thereof is connected to the power source voltage VC.

In the circuit described above, only when an input signal to the voltage booster 40 (i.e., the output signal from a decoder 50) is set at logic level "1", the MOS transistor 101 in the switching circuit 100 is turned on so as to supply a boosted voltage VH from the output end M of the boosted voltage retention circuit 70 to an end J.

Figure 5:
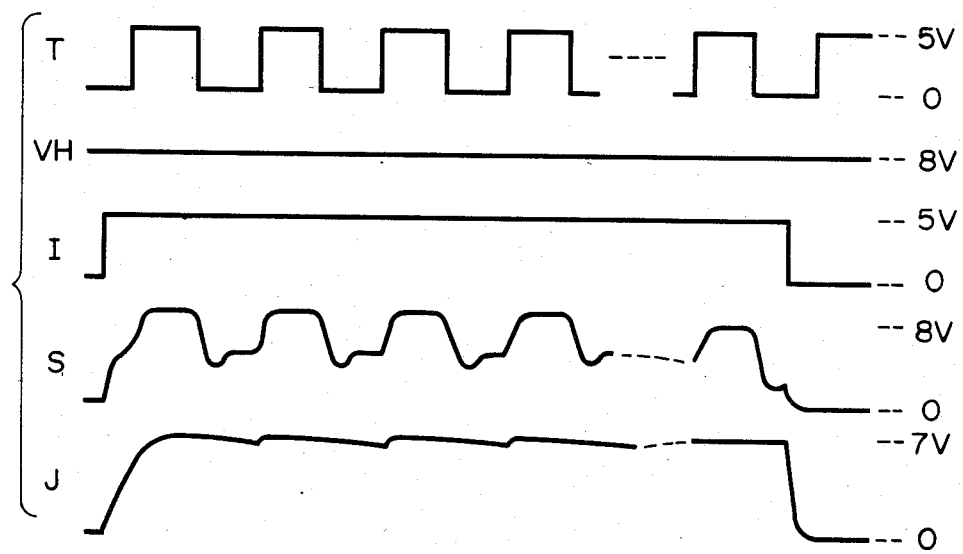
FIG. 5 is a timing chart for explaining the operation of the circuit shown in FIG. 4.

The operation of the circuit shown in FIG. 4 will be described with reference to the timing chart shown in FIG. 5. When the oscillator 103 is started, a predetermined pulse signal appears at the output end T. It is then assumed that a voltage of 8 V appears as the boosted voltage VH at the output end M. If the decoder 50 is disabled and the signal of logic level "0" appears at the end I, the signal of logic level "0" is produced by the MOS transistor 41 and is supplied to the end J which thus becomes logic level "0". At the same time, the signal of logic level "0" is supplied to the end S through the MOS transistor 102. The signal of logic level "1" is supplied from the inverter 47 to the end K, so that the MOS transistor 44 is turned on, and the end L is set to logic level "0". Meanwhile, the end S is set to logic level "0", so that the MOS transistor 101 is turned off, thereby electrically disconnecting the end M from the end J. In this case, the signal of logic level "0" appears as an output signal at the end J.

However, when the decoder 50 is enabled and the signal of logic level "1" appears at the end I, the signals of logic level "1" are supplied from the MOS transistors 41 and 102 to the ends J and S, respectively. Thereafter, the end K is set to logic level "0" by the inverter 47, and the MOS transistor 44 is turned off. Since the end J is set to logic level "1" by the MOS transistor 41 before the MOS transistor 44 is turned off, the signal of logic level "1" from the MOS transistor 43 is supplied to the end L after the MOS transistor 44 is turned off. Thus, the end L is set to logic level "1", so that the signal of logic level "1" at the end J is boosted through the capacitor 46.

The signal set to logic level "1" (i.e., about 4 V) at the end S by an output signal from the MOS transistor 102 is boosted by the output pulse from the oscillator 103 through the capacitor 104. In other words, the signal at the end S varies in a range between the boosted voltage (about 8 V) and the voltage (4 V) corresponding to the signal of logic level "1" in accordance with the voltage of the pulse appearing at the end T. Therefore, when the boosted voltage appearing at the end J is decreased by a leakage current at the p-n junction, the MOS transistor 101 is kept on while the voltage at the end S is boosted. As a result, the end M is electrically connected to the end J through the MOS transistor 101.

Figure 6:
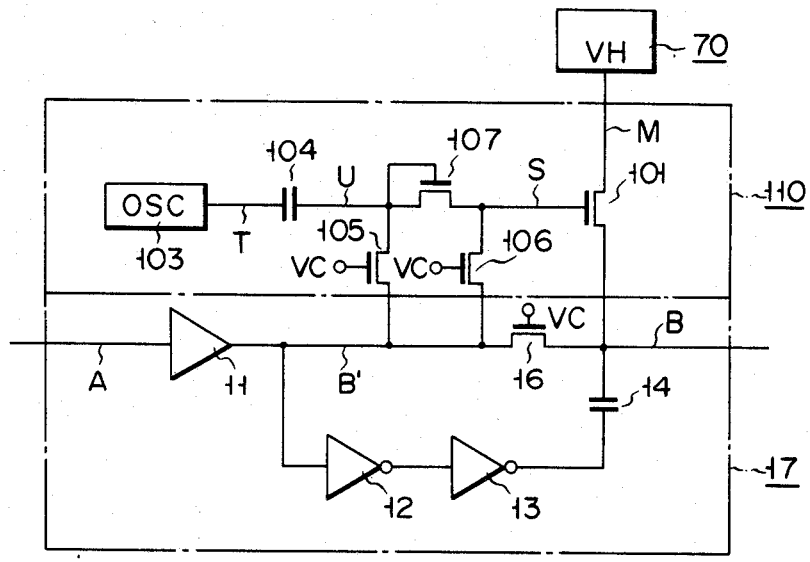
FIG. 6 is a circuit diagram of a logic circuit according to a fourth embodiment of the present invention.

FIG. 6 is a circuit diagram of a logic circuit according to a fourth embodiment of the present invention. This circuit is an improvement over the conventional circuit shown in FIG. 1A, and the same reference numerals as used in FIG. 1A denote the same parts in FIG. 6. An enhancement-type MOS transistor 16 arranged between an output end B' of an input buffer circuit 11 and a signal output end B is added to the voltage booster 15 (FIG. 2) so as to constitute a voltage booster 17 shown in FIG. 6. The gate of the MOS transistor 16 is connected to a power source voltage VC. In addition to the MOS transistor 16, the logic circuit shown in FIG. 6 has a switching circuit 110 and a boosted voltage retention circuit 70 having an output end M. The switching circuit 110 has an MOS transistor 101, an oscillator 103 and a capacitor 104 in the same manner as the switching circuit 100 shown in FIG. 4. The switching circuit 110 also has three enhancement-type MOS transistors 105 to 107. The MOS transistor 105 is connected between the output end B' of the input buffer circuit 11 and an end U connected to one end of the capacitor 104. The gate of the MOS transistor 105 is connected to the power source voltage VC. The MOS transistor 106 is connected between the output end B' and the end S connected to the gate of the MOS transistor 101. The gate of the MOS transistor 106 is connected to the power source voltage VC. The MOS transistor 107 is connected between the ends U and S, and the gate thereof is connected to the end U.

In the circuit having the above arrangement, when the end A is set at logic level "1", signals of logic level "1" appear at the ends B' and B, respectively. Thereafter, the signal of logic level "1" at the end B is boosted through inverters 12 and 13, and the capacitor 14. A signal having the same waveform as that of the signal at the end S (FIG. 5) appears at the end U. The signal obtained at the end U is rectified by the MOS transistor 107, so that a predetermined boosted voltage is obtained at the end S. Therefore, even if the boosted voltage at the end B decreases, the MOS transistor 101 is turned on so as to supply a constant boosted voltage from the end M to the end B.

Figure 7:
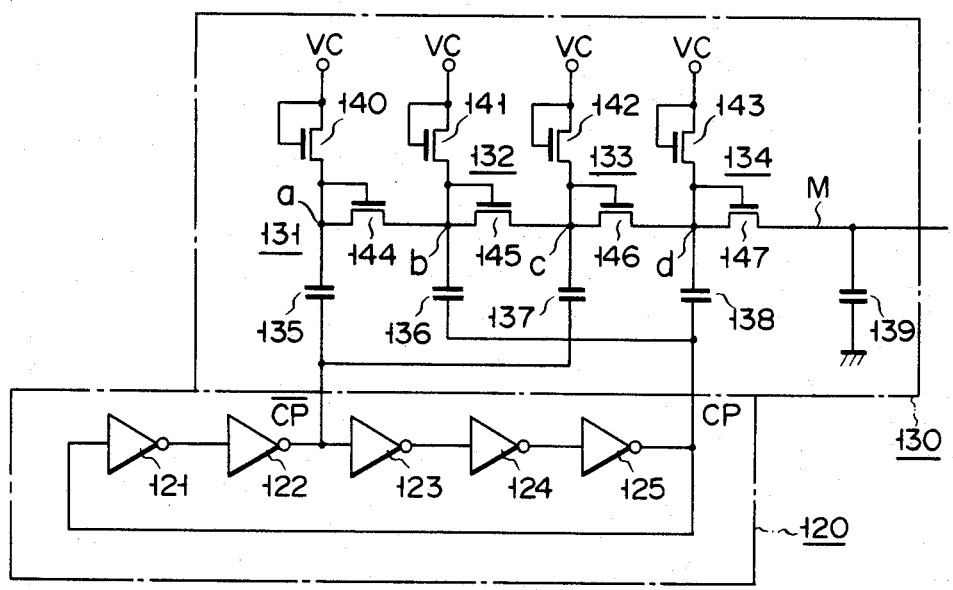
FIG. 7 is a circuit diagram of a boosted voltage retention circuit used for the circuits in FIGS. 2, 3, 4 and 6.
Figure 8:
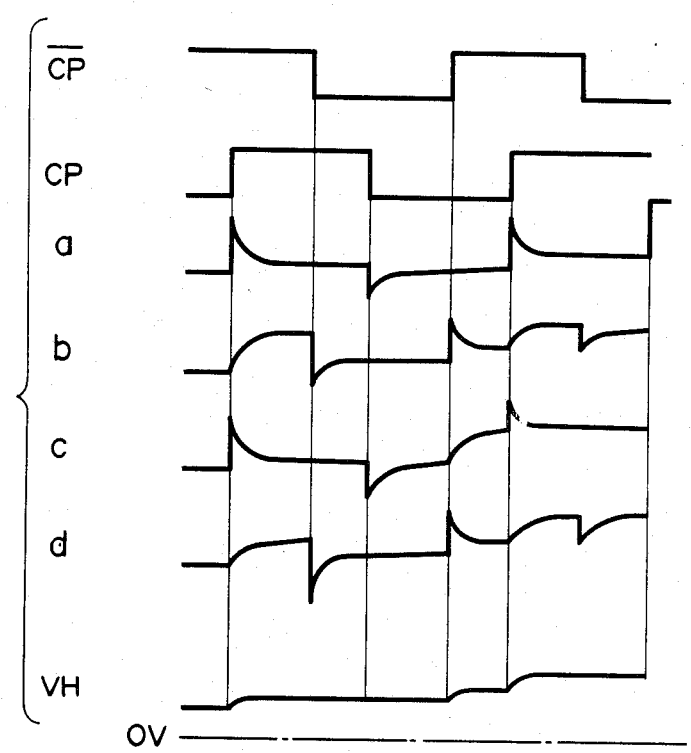
FIG. 8 is a timing chart for explaining the operation of the circuit shown in FIG. 7.

FIG. 7 is a circuit diagram of a boosted voltage retention circuit 70 used in the logic circuits shown in FIGS. 2, 3, 4 and 6. The circuit 70 has a known arrangement which comprises an oscillator 120 and a voltage booster 130. The oscillator 120 comprises a closed loop of five inverters 121 to 125. The voltage booster 130 has four voltage booster sections 131 to 134 which receive two-phase signals appearing at ends CP and $\overline{CP}$ of the oscillator 120. Reference numerals 135 to 139 denote capacitors; and 140 to 147, enhancement-type MOS transistors. In this circuit, a boosted voltage is sequentially produced at ends a to d of the voltage booster 130 in accordance with the output waveforms at the output ends CP and $\overline{CP}$ of the oscillator 120, as shown in the timing chart of FIG. 8. A booster voltage VH at the output end M is gradually increased and eventually reaches a voltage of 8 V. The voltage VH is then kept steady.

Figure 9A:
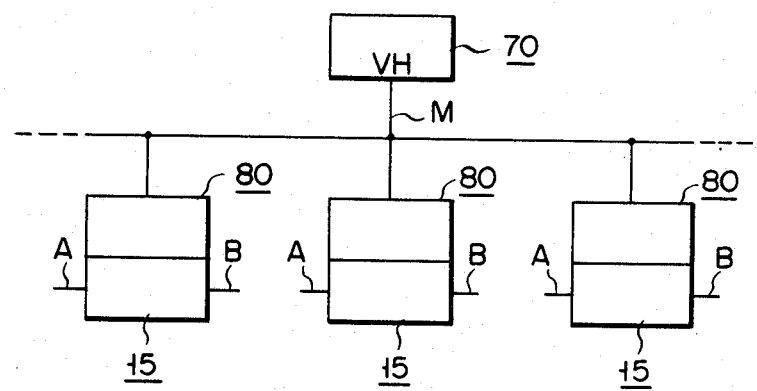
FIGS. 9A to 9D are block diagrams of logic circuits which incorporate the logic circuits according to the first to fourth embodiments of the present invention, respectively.

FIG. 9A is a block diagram showing a circuit configuration using the switching circuits 80 and the voltage boosters 15, as shown in FIG. 2. Each set of a switching circuit 80 and a voltage booster 15 is commonly connected to the output end M of the boosted voltage retention circuit 70: the respective sets are connected in parallel with each other. The boosted voltage VH is simultaneously supplied to the respective switching circuits 80. In general, the current supply capacity of the boosted voltage retention circuit 70 shown in FIG. 7 is very small. However, the boosted voltage VH at the output end M is only required to compensate for a component corresponding to a leakage current from a voltage applied to each signal output end B. Furthermore, in any switching circuit 80 other than one whose input signal is set at logic level "1", the boosted voltage VH may not be lowered. It is, possible, therefore, to apply the boosted voltage VH to a plurality of switching circuits 80 from the single output end M.

Figure 9B:
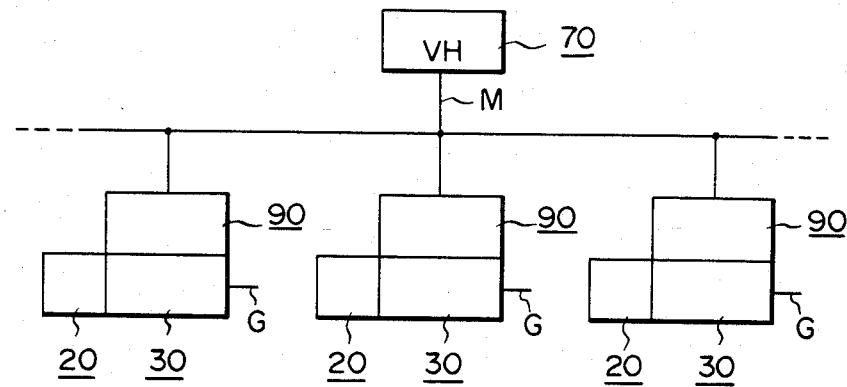
Figure 9C:
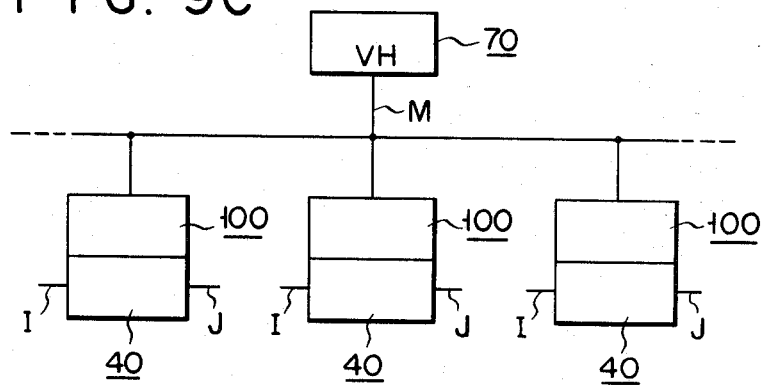
Figure 9D:
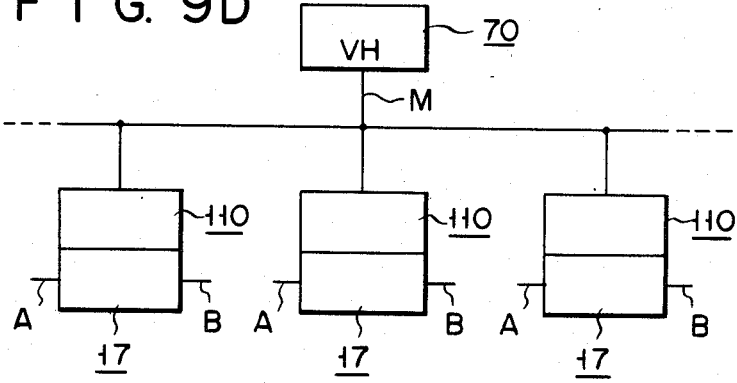

As shown in FIGS. 9B, 9C and 9D, the concept of the output signal from the single boosted voltage retention circuit 70 being supplied to a plurality of sections can be applied to the circuit arrangements shown in FIGS. 3, 4 and 6, respectively.

FIGS. 10 to 16 are circuit diagrams of logic circuits according to fifth to eleventh embodiments of the present invention. In the first to fourth embodiments respectively shown in FIGS. 2, 3, 4 and 6, when the input signals become logic level "1", the corresponding voltages are boosted by the voltage boosters 15, 30, 40 and 17, respectively. The leakage components of these boosted voltages are compensated for by the boosted voltages VH from the boosted voltage retention circuits 70, respectively, thereby applying steady voltages to the corresponding semiconductor memories or the like. However, in the fifth to eleventh embodiments, a voltage which has been steadily boosted to a predetermined voltage is directly applied to the signal output end.

Figure 10:
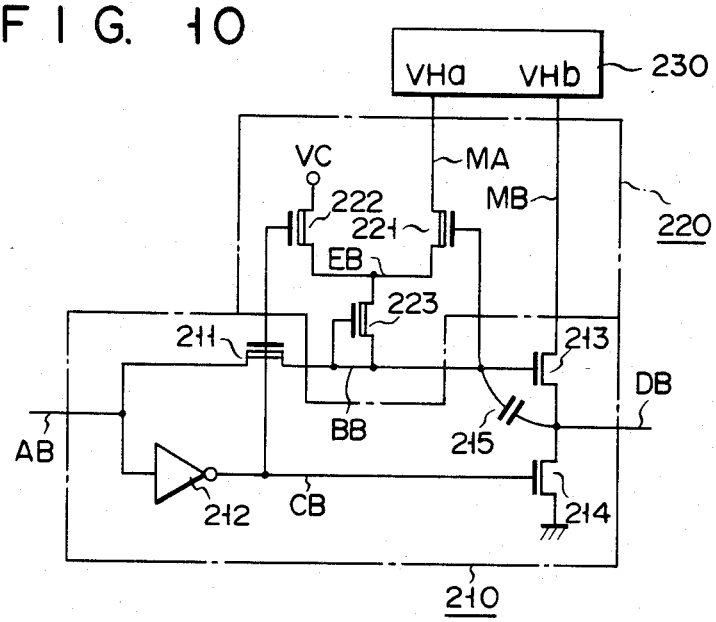
FIGS. 10 to 16 are circuit diagrams of logic circuits according to the fifth to eleventh embodiments of the present invention, respectively.

The logic circuit shown in FIG. 10 comprises: a voltage booster 210, a switching circuit 220, and a boosted voltage retention circuit 230 which has first and second output ends MA and MB for steadily producing first and second boosted voltages VHa and VHb which are boosted higher than the power source voltage VC (e.g., 5 V), respectively. The voltage booster 210 comprises a depletion-type MOS transistor 211, an inverter 212, two enhancement-type MOS transistors 213 and 214, and a capacitor 215. The drain of the MOS transistor 211 is connected to a signal input end AB, the source thereof is connected to an internal boosted voltage end BB, and the gate thereof is connected to the end CB. The input end of the inverter 212 is connected to the signal input end AB, and the output end thereof is connected to the end CB. The drain of the MOS transistor 213 is connected to the second output end MB of the boosted voltage retention circuit 230, the source thereof is connected to the signal output end DB, and the gate thereof is connected to the end BB. The drain of the MOS transistor 214 is connected to the end DB, the source thereof is grounded, and the gate thereof is connected to the end CB. One end of the capacitor 215 is connected to the end DB, and the other end is connected to the end BB.

The switching circuit 220 has three depletion-type MOS transistors 221 to 223. The drain of the MOS transistor 221 is connected to the first output end MA of the boosted voltage retention circuit 230, the source thereof is connected to an end EB, and the gate thereof is connected to the end BB. The drain of the MOS transistor 222 is connected to the power source voltage VC, the source thereof is connected to the end EB, and the gate thereof is connected to the end CB. The drain of the MOS transistor 223 is connected to the end EB, and the source and gate thereof are commonly connected to the end BB.

In the switching circuit 220, a transconductance gm of the MOS transistor 222 is preset to be sufficiently greater than that of the MOS transistor 223. In the boosted voltage retention circuit 230, a first boosted voltage VHa which is preset and kept at a voltage of 8 V is produced at the first output end MA, and a second boosted voltage VHb which is preset and kept at a voltage of 7 V is produced at the second output end MB.

In the logic circuit having the arrangement described above, when an input signal supplied to the end AB is set to be logic level "0", the signal of logic level "0" is inverted by the inverter 212 and is supplied to the end CB, so that the end CB is set at logic level "1". The MOS transistors 211, 214 and 222 are then turned on. Since the transconductance gm of the MOS transistor 222 is sufficiently greater than that of the MOS transistor 223, the end BB is set to approximate logic level "0" (0 V), and the end EB is set to approximate logic level "1" (5 V). Assume that a condition $VG221 - Vth221 < VS221$ must be satisfied to turn off the MOS transistor 221 (where Vth221 is the threshold voltage of the MOS transistor 221, VG221 is the source voltage thereof, and the VS221 is the source voltage thereof). If the MOS transistor 221 has the typical threshold voltage (e.g., $-3$ V) of the depletion-type transistor, the gate and source voltages VG221 and VS221 are substantially 0 V and 5 V, respectively, thereby satisfying the above condition. The MOS transistor 221 is thus turned off. In the voltage booster 210, the MOS transistor 213 is turned off, and the MOS transistor 214 is turned on, so that the signal output end DB is set at logic level "0".

Assume that the input signal goes to logic level "1". Immediately after the input signal becomes high level, the output end CB of the inverter 212 is kept at logic level "1", so that the MOS transistor 211 is kept ON. The high level signal is supplied from the MOS transistor 211 to the end BB, so that the end BB is kept at $+5$ V. As a result, the MOS transistors 213 and 221 are turned on. When a predetermined time interval has elapsed after the signal input end AB becomes high, the signal of logic level "1" is inverted by the inverter 212, so that the end CB goes low. The MOS transistor 214 is then turned off. The conditions $VG211 - Vth211 < VS211$ and $VG222 - Vth222 < VS222$ must be satisfied to turn off the MOS transistors 211 and 222 (where Vth211 and Vth222 are threshold voltages of the MOS transistors 211 and 222, respectively, VG211 and VG222 are gate voltages thereof, and VS211 and VS222 are source voltages thereof). In order to satisfy the above conditions, the MOS transistors 211 and 222 must have the typical threshold voltages of the depletion-type transistor. When the MOS transistor 214 is turned off, the high level signal is supplied from the MOS transistor 213. This signal voltage is then boosted by the capacitor 215. The signal at the end BB has a voltage sufficiently higher than a voltage of $+5$ V. When the voltage at the end BB is boosted, the MOS transistor 221 in the switching circuit 220 is turned on. The first boosted voltage VHa is applied to the end BB, so that the voltage at the end BB is further boosted. If the capacitor 215 has a sufficiently large capacitance, the voltage at the end BB can be boosted to 8 V by the capacitor 215 alone and the first boosted voltage VHa serves to charge the end BB to compensate for a leakage current at the signal output end DB. Eventually, the voltage at the end BB is boosted to a voltage of 8 V. When the voltage at the end BB reaches 8 V, the signal output end DB is set by the MOS transistor 213 at the second boosted voltage VHb (i.e., 7 V). As a result, the input signal of high level ($+5$ V) is boosted to a voltage of 7 V, and the boosted voltage appears at the signal output end DB. In this condition, even if a leakage current flows through the end DB, additional charge flows from the boosted voltage retention circuit 230, thereby stably maintaining the voltage at 7 V.

Figure 11:
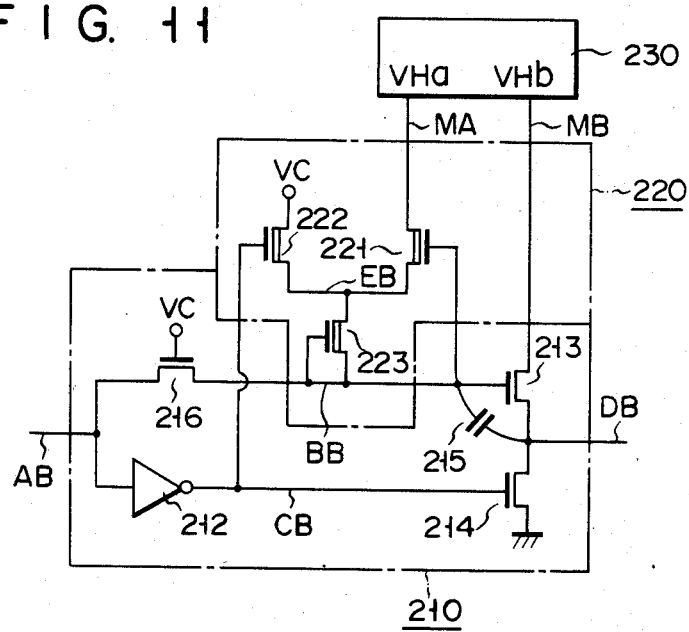

In the circuit shown in FIG. 10, the depletion-type MOS transistor 211 is connected between the ends AB and BB in the voltage booster 210. However, as shown in FIG. 11 illustrating the sixth embodiment, an enhancement-type MOS transistor 216 having a gate connected to the power source voltage VC may be connected between the ends AB and BB.

Figure 12:
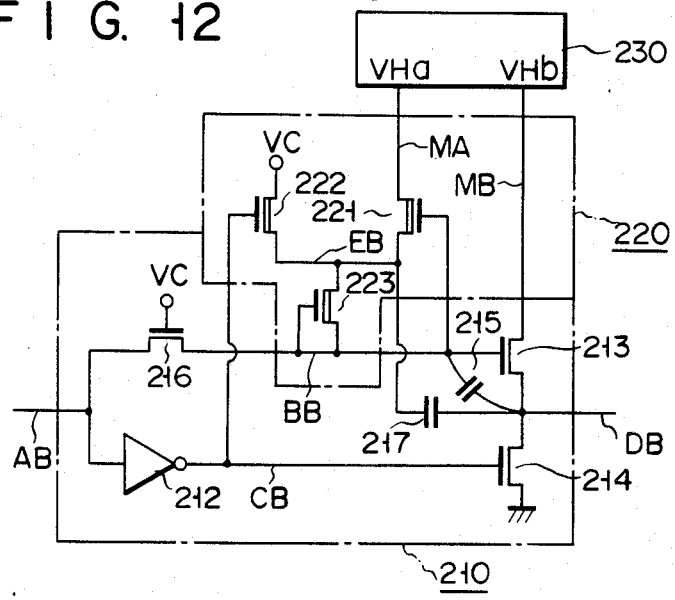

FIG. 12 shows a logic circuit according to a seventh embodiment of the present invention. The circuit of this embodiment is substantially the same as that shown in FIG. 11, except that a capacitor 217 is additionally connected between ends DB and EB. According to the circuit shown in FIG. 12, when the end CB is set at logic level "1" and the end EB is set by the MOS transistor 222 at logic level "1", the capacitor 217 is charged. When the ends AB and DB become high, a voltage at the end EB is sufficiently boosted by the MOS transistor 213 and the capacitor 217 and the voltage at the end BB is also boosted. Since the capacitor 217 is already charged when the end AB is at logic level "0", the inverter 212 need not have so long a delay time as its counter part of the logic circuit shown in FIG. 11. It is thus easy to set the delay time to the inverter 217. Moreover, the capacitor 215 can be dispensed with.

Figure 13:
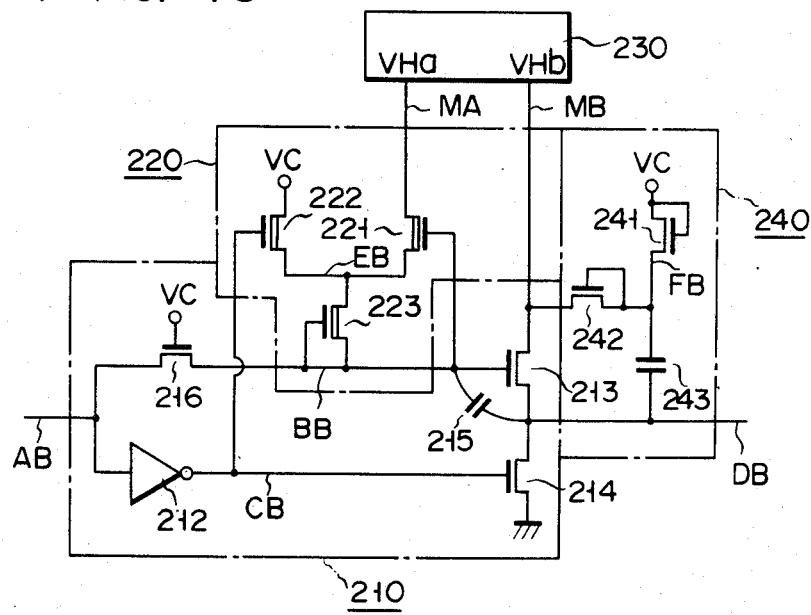

FIG. 13 shows a logic circuit according to the eighth embodiment of the present invention. This circuit is substantially the same as that shown in FIG. 11, except that a voltage booster 240 is additionally arranged between ends DB and MB. The voltage booster 240 comprises two enhancement-type MOS transistors 241 and 242, and a capacitor 243. The MOS transistor 241 is connected between a power source voltage VC and an end FB. The MOS transistor 242 is connected between the end FB and an end MB. The capacitor 243 is connected between the end FB and the end DB. The gate of the MOS transistor 241 is connected to the power source voltage VC, and the gate of the MOS transistor is connected to the end FB.

According to the logic circuit of the eighth embodiment, when the end AB is set at logic level "0", the end FB in the voltage booster 240 is set at a voltage VC−Vth241 (e.g., 4 V where Vth241 is the threshold voltage of the MOS transistor 241). As the end MB is constantly kept at 7 V (VHb), the MOS transistor 242 is turned off, and no current flows from the end MB.

However, when the end AB becomes logic level "1" and then the end DB becomes logic level "1" corresponding to a voltage of 7 V, a voltage at the end FB is boosted to a voltage of about 10 V through the capacitor 243, thereby turning on the MOS transistor 242. Therefore, the boosted voltage appearing at the end FB is applied to the end MB. The logic circuit shown in FIG. 13 has an advantage in that its boosted voltage retention circuit 230 may only provide the second auxiliary voltage VHb having a smaller flow of charge, as compared with the boosted voltage retention circuit 230 shown in FIG. 11.

Figure 14:
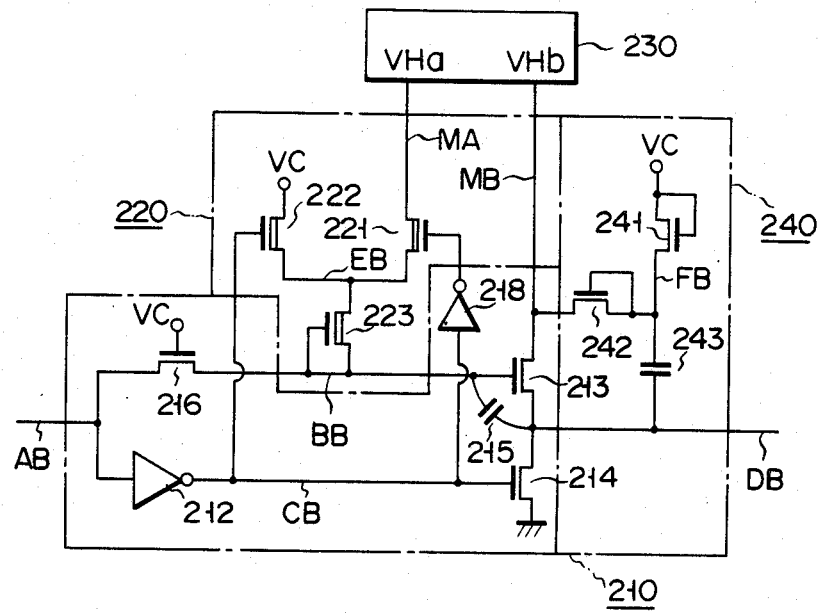

FIG. 14 shows a logic circuit according to a ninth embodiment of the present invention. This logic circuit is substantially the same as that shown in FIG. 13, except that the input end of an inverter 218 is connected to an end CB instead of having the gate of the MOS transistor 221 of the switching circuit 220 connected to the end BB, and also, the output end of the inverter 218 is connected to the gate of an MOS transistor 221. In the logic circuit shown in FIG. 14, a signal at the end CB is delayed by the inverter 218, and a delayed signal is supplied to the gate of the MOS transistor 221, thereby preventing the MOS transistors 221 and 222 of the switching circuit 220 from operating simultaneously. More specifically, when the end AB becomes logic level "1", the end CB is set by the inverter 212 to be logic level "0". The MOS transistor 222 is then turned off, and then the gate of the MOS transistor 221 becomes high. As a result, the MOS transistor 221 is turned on.

Figure 15:
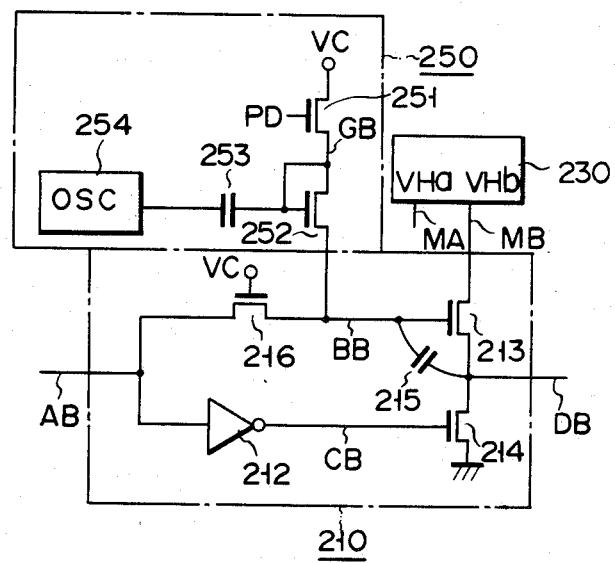

In the circuit shown in FIG. 11, the boosted voltage obtained at the internal boosted voltage end BB is kept steady by supplying an additional charge to the boosted voltage VHa from the boosted voltage retention circuit 230. However, the above operation may be performed in a manner to be described with reference to FIG. 15. In FIG. 15, which illustrates the tenth embodiment of the present invention, an MOS transistor 213 in the voltage booster 210 is connected to a second output end MB of a boosted voltage retention circuit 230. An additional voltage booster 250 is connected to an internal boosted voltage end BB. The voltage booster 250 comprises two enhancement-type MOS transistors 251 and 252, a capacitor 253, and an oscillator (OSC) 254. A series circuit of the MOS transistors 251 and 252 is connected between a power source voltage VC and the end BB. The gate of the MOS transistor 252 is connected to a node (end) GB between the MOS transistors 251 and 252. One end of the capacitor 253 is connected to the gate of the MOS transistor 252, and the other end thereof is connected to the output end of the oscillator 254. A power down signal PD is supplied to the gate of the MOS transistor 251 so as to switch the logic circuit to a low-power consumption mode.

In the above embodiment, when an end AB becomes logic level "1", a signal of logic level "1" is supplied from the MOS transistor 216 to the end BB. Thereafter, the MOS transistor 214 is turned off, and a voltage at the end BB is boosted. The end GB in the voltage booster 250 is kept at a voltage (VC−Vth251) (e.g., 4 V) where Vth251 is the threshold voltage of the MOS transistor 251 when an output from the oscillator 254 is kept at 0 V. However, when the output signal of 5 V is produced by the oscillator 254, a voltage at the end GB is kept at 9 V (5 V+4 V). The voltage at the end BB in the voltage boosting mode is kept steady by the voltage booster 250.

Figure 16:
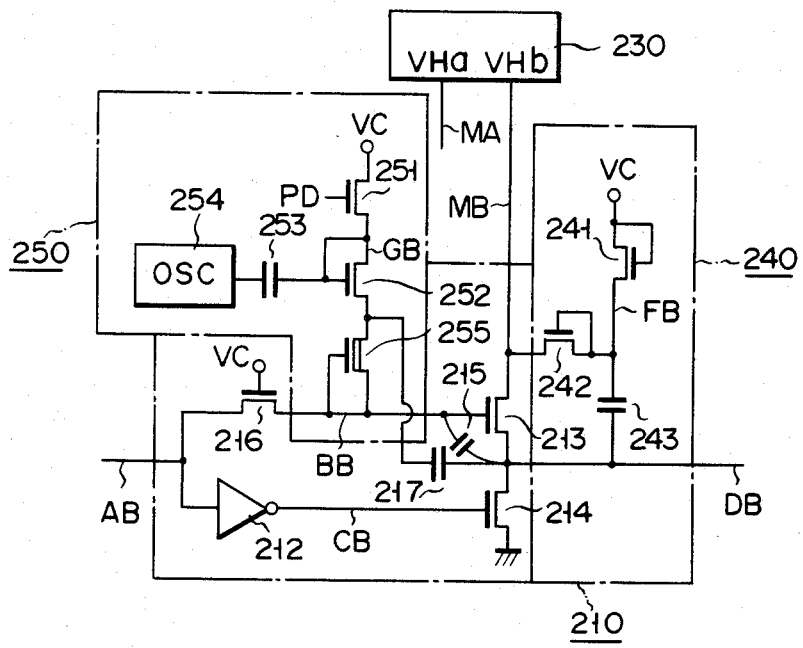

FIG. 16 shows a logic circuit according to an eleventh embodiment of the present invention. This circuit is substantially the same as that shown in FIG. 15, except that first, a depletion-type MOS transistor 255 is connected between the MOS transistor 252 (FIG. 15) and the end BB (FIG. 15), second, a capacitor 217 which is the same as that shown in FIG. 12 is connected between the signal output end DB and a node (end) of a series circuit of the MOS transistors 255 and 252, and third, a voltage booster 240 which is the same as that shown in FIG. 15 is arranged therein.

The circuit of the eleventh embodiment has the additional MOS transistor and capacitor, and the current supply capacity of the voltage booster 250 is increased as compared with the voltage booster shown in FIG. 15. Furthermore, the circuit of this embodiment has the voltage booster 240, so that the current supply capacity of the second boosted voltage VHb from the boosted voltage retention circuit 230 can be small. A power down signal PD is used in the same manner as in the embodiment shown in FIG. 15. More specifically, the power down signal PD of logic level "0" is supplied to the MOS transistor 251 which is then turned off. The end BB is set at logic level "0". As a result, the current consumption of the logic circuit as a whole can be substantially zero.

Figure 17:
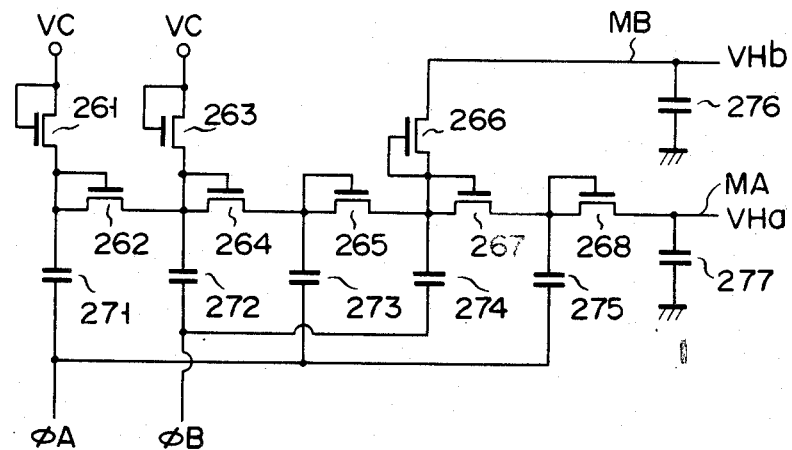
FIG. 17 is a circuit diagram of a boosted voltage retention circuit used in the circuits shown in FIGS. 10, 11, 12, 13, 14, 15 and 16.
Figure 18:
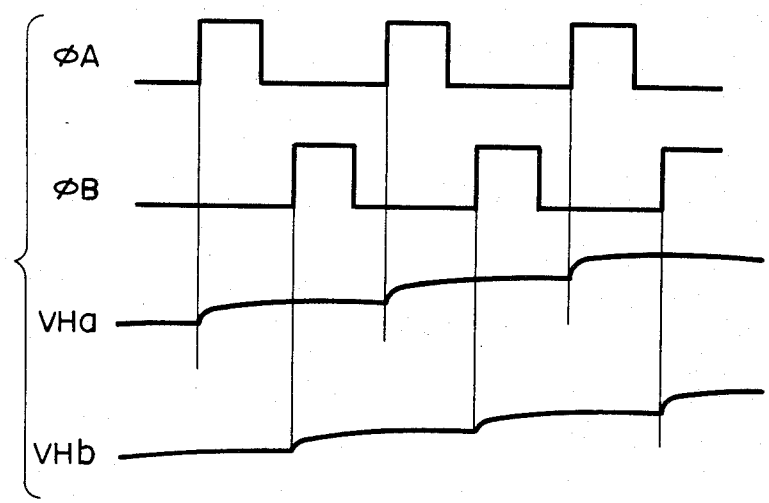
FIG. 18 is a timing chart for explaining the operation of the circuit shown in FIG. 17.

FIG. 17 is a circuit diagram showing the detailed arrangement of a boosted voltage retention circuit 230 used for the logic circuits in FIGS. 10 to 16. The circuit 230 comprises eight enhancement-type MOS transistors 261 to 268, five coupling capacitors 271 to 275, and two integrating capacitors 276 and 277. A signal φA shown in FIG. 18 is supplied to one end of the capacitor 271, and a signal φB shown in FIG. 18 is supplied to one end of the capacitor 272. Therefore, the boosted voltages VHa and VHb can be produced at ends MA and MB of the capacitors 276 and 277, respectively.

Figure 19A:
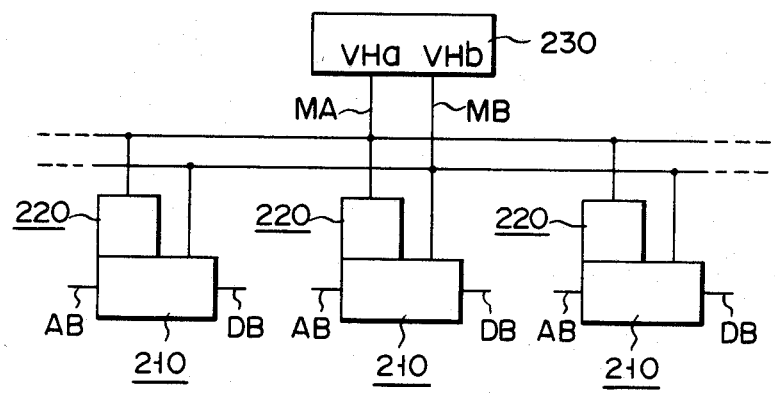
FIGS. 19A and 19B are block diagrams of logic circuits which incorporate the logic circuit shown in FIG. 10 and the logic circuit shown in FIG. 15 or 16, respectively.

FIG. 19A is a block diagram of a circuit using a plurality of sets of a voltage booster 210 and a switching circuit 220 of the type shown in FIG. 10. The boosted voltage VHa from the first output end MA of the single boosted voltage retention circuit 230 is simultaneously supplied to all of the switching circuits 220, which are connected in parallel with each other. Similarly, the boosted voltage VHb from the second output end MB of the single boosted voltage retention circuit 230 is supplied to the drains of the MOS transistors 213 of the voltage boosters 210, which are connected in parallel with each other. In short, this circuit comprises a plurality of sections using the boosted voltages VHa and VHb and a single boosted voltage retention circuit 230.

Figure 19B:
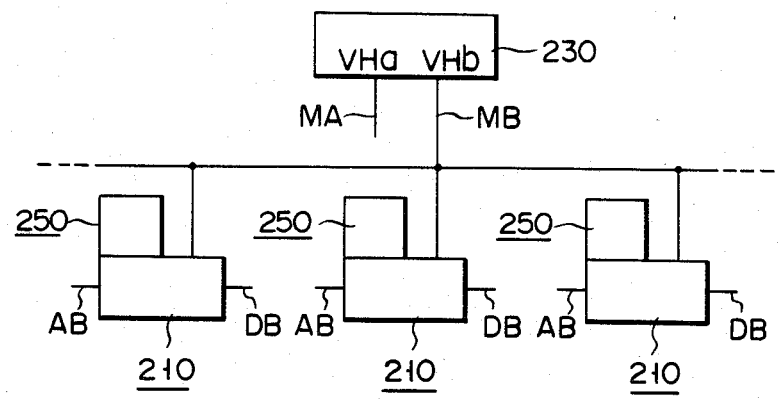

As shown in FIG. 19B, the concept of the output from the single boosted voltage retention circuit 230 being used in a plurality of sections can be applied to the circuit shown in FIG. 15 or 16.

Figure 20B:
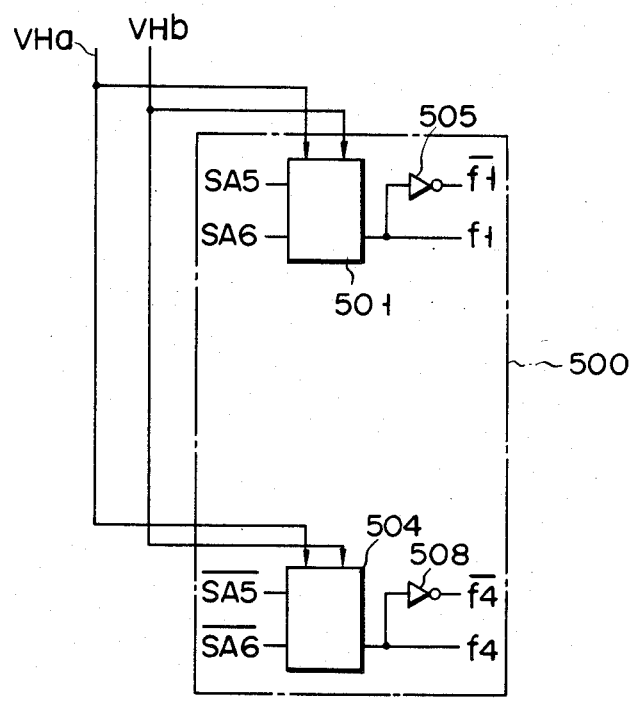

FIGS. 20A and 20B together comprise a circuit diagram of a decoder when the circuit shown in FIG. 19A is applied to an address decoder. One of row lines WL1 to WL64 is selected by internal address signals SA1, $\overline{SA1}$, SA2, $\overline{SA2}$, ..., SA6 and $\overline{SA6}$ which are produced from an address buffer (not shown). It should be noted that the address buffer (not shown) receives external 6-bit address signals SA1 to SA6.

The boosted voltage retention circuit 230 may have only one output end, instead of two, like the boosted voltage retention circuit 70 shown in FIG. 2. In other words, the boosted voltage may be applied from one end to the switching circuit 220 and the voltage booster 210.

The decoder shown in FIGS. 20A and 20B comprises a first address decoder 300, a second address decoder 400, and a third address decoder 500. The first address decoder 300 comprises four decoders 301 to 304, each of which receives any two of the internal address signals SA1, $\overline{SA1}$, SA2 and $\overline{SA2}$. The decoders 301 to 304 respectively correspond to output ends e1 to e4, but only one of the output ends e1 to e4 is selected at a time. Each of the decoders 301 to 304 comprises a signal decoding section and a logic circuit section (e.g., the circuit shown in FIG. 10) for boosting the voltage of a signal from the decoding section. The first and second boosted voltages VHa and VHb (FIG. 19A) from the single boosted voltage retention circuit 230 are simultaneously applied to the logic circuit sections of the decoders 301 to 304.

The second address decoder 400 comprises 16 decoders 401 to 416. A set of four decoders 401 to 404 is connected to the output end e1; other sets of four decoders 405 to 408, 409 to 412, and 413 to 416 are also connected in the same manner as the set of four decoders 401 to 404. The set of four decoders 401 to 404 receives one of the combinations of internal address signals SA3 and SA4, $\overline{SA3}$ and SA4, SA3 and $\overline{SA4}$ and SA3 and SA4, the output signal from the output end e1, and a signal obtained by inverting this output signal via an inverter 601. The set of four decoders 405 to 408 receives one of the combinations described above, the output signal from the output end e2, and a signal obtained by inverting this output signal by an inverter 602. The set of four decoders 409 to 412 receives one of the combinations described above, the output signal from the output end e3, and a signal obtained by inverting this output signal via an inverter 603. Similarly, the set of four decoders 413 to 416 receives one of the combinations described above, the output signal from the output end e4, and a signal obtained by inverting this output signal via an inverter 604. The decoders 401 to 416 correspond to 16 output ends RD1 to RD16, but only one of the output ends RD1 to RD16 is selected at a time. The internal arrangement of the decoders 401 to 416 is exemplified by the decoder 401. The decoder 401 comprises: three enhancement-type MOS transistors 451, 452 and 453 which receive at their gates the signal inverted by the inverter 601 and the internal address signals SA3 and SA4, respectively; an enhancement-type MOS transistor 454 which receives the output signal at the output end e1 and is controlled thereby; and a depletion-type MOS transistor 455 connected in series with the MOS transistor 454.

Referring to FIG. 20B, the third address decoder 500 comprises four decoders 501 to 504 and four inverters 505 to 508 respectively corresponding thereto. Each of the decoders 501 to 504 receives one of the combinations of internal address signals SA5 and SA6, $\overline{SA5}$ and SA6, SA5 and $\overline{SA6}$, and $\overline{SA5}$ and $\overline{SA6}$. The decoders 501 to 504 select pairs of output ends from f1 and its corresponding inverted output end $\overline{f1}$ to output end f4 and its corresponding inverted output end $\overline{f4}$, respectively. However, only one of the pairs of output ends f1, $\overline{f1}$ to f4, $\overline{f4}$ is selected at a time. The inverter 505 is arranged to invert an output signal from the output end f1; other inverters are also arranged in a similar manner as is the inverter 505. Each of the decoders 501 to 504 comprises a signal decoding section and a logic circuit section for boosting a voltage of a signal from the signal decoding section. The first and second boosted voltages VHa and VHb from the single boosted voltage retention circuit 230 (FIG. 20A) are simultaneously supplied to each of the decoders 501 to 504.

The 16 sets of four row lines WL1 to WL64 are connected to the switching circuits 701 to 764, each set of four of which is respectively connected to the output ends RD1 to RD16, respectively. The internal arrangement of the switching circuits 701 to 764 is exemplified by the switching circuit 701 as shown in FIG. 20A. The switching circuit 701 comprises an enhancement-type MOS transistor 771 connected between the output end RD1 and the row line WL1, and an enhancement-type MOS transistor 772 connected between the row line WL1 and the ground. The signals at pairs of output ends f1 and its corresponding inverted output end $\overline{f1}$ to output end f4 and its corresponding inverted output end $\overline{f4}$ are respectively supplied to the four switching circuits 701 to 704, ..., or 761 to 764, respectively. For example, the gates of the transistors 771 in the switching circuits 701 to 704 receive the signals from the output ends f1 to f4, respectively, whereas the gates of the transistors 772 in the switching circuits 701 to 704 receive the signals from the inverted output ends $\overline{f1}$ to $\overline{f4}$, respectively. Other sets of four switching circuits are operated in a manner similar to the set of switching circuits 701 to 704.

The address signals SA1 and SA2 (each comprising one bit) are used to select one of the output ends e1 to e4 of the first address decoder 300. The address signals SA3 and SA4 (each comprising one bit) are used to select one of sets of output ends RD1 to RD4, RD5 to RD8, RD9 to RD12 or RD13 to RD16 of the second address decoder 400. The address signals SA5 and SA6 (each comprising one bit) are used to select one of the four output ends f1 to f4 of the third address decoder 500 so as to turn on the transistors 771 in the 16 switching circuits among 64 switching circuits 701 to 764, whereas the transistors 772 thereof are turned off, thereby driving one row line.

Since the logic circuit section is arranged at each output stage of the four decoders 301 to 304 of the first address decoder 300, a voltage sufficiently higher than the power source voltage VC is applied to the gates of the MOS transistors in the decoder 400. Therefore, a signal of logic level "1" appears at the corresponding output end RD. Furthermore, since the transistor 771 of each of the switching circuits 701 to 764 is of an enhancement type and receives a voltage sufficiently higher than the power source voltage VC at its gate selected by the third address decoder 500, the selected row line WL has a sufficiently high voltage or logic level "1" (about the power source voltage VC). Furthermore, as previously described, the boosted voltages at the selected one of the output ends e1 to e4 and the selected one of the output ends f1 to f4 may not be lowered due to the leakage current. A sufficiently high voltage (corresponding to logic level "1") can steadily appear on the selected row line WL. If the logic circuit section is not arranged in each output stage of the decoders 301 to 304, and the transistor has a threshold voltage of 0 V, the variation in the threshold voltage will result in the variation in the potential at the selected output end RD. However, according to the present invention, such a variation will not occur.

What we claim is:

1. A logic circuit comprising:
   voltage boosting means connected to a power source voltage, said voltage boosting means receiving an input signal and having an output for supplying an output signal, said voltage boosting means being constructed and arranged so that the voltage level of said output signal is boosted above the level of said power source voltage when said input signal changes to a predetermined level;
   voltage retaining means having an output end for outputting an auxiliary voltage higher than said power source voltage; and
   switching means connected between said output end of said voltage retaining means and said voltage boosting means and being responsive to said boosting operation of said voltage boosting means to connect said auxiliary voltage to said output of said voltage boosting means.

2. A circuit according to claim 1, wherein said switching means comprises a depletion-type MOS transistor connected between said output of said voltage boosting means and said output end of said voltage retaining means and means for keeping said depletion-type MOS transistor in cut-off state before the level of said input signal is changed to said predetermined level.

3. A circuit according to claim 1, wherein said switching means comprises an enhancement-type MOS transistor connected between said output of said voltage boosting means and said output end of said voltage retaining means and booster means connected to the gate of said enhancement-type MOS transistor.

4. A circuit according to claim 1, wherein said switching means comprises first, second and third depletion-type MOS transistors and a first end, said first depletion-type MOS transistor being inserted between said output end of said voltage retaining means and said first end, said second depletion-type MOS transistor being inserted between said power source voltage and said first end, said third depletion-type MOS transistor being inserted between said first end and said output of said voltage boosting means, a gate of said second depletion-type MOS transistor receiving a signal which causes said second depletion-type MOS transistor to turn off when the voltage of said input signal is boosted by said voltage boosting means, and gates of said first and third depletion-type MOS transistors receiving a signal which causes said first and third depletion-type MOS transistors to simultaneously turn on when the voltage level of said output signal is boosted by said voltage boosting means.

5. A circuit according to claim 4, wherein said second depletion-type MOS transistor has a transconductance gm which is sufficiently greater than the transconductance gm of said third depletion-type MOS transistor.

6. A circuit according to claim 1, wherein said switching means comprises first and second enhancement-type MOS transistors, an oscillator, a capacitor and a first end, said first enhancement-type MOS transistor being inserted between said output end of said voltage retaining means and said output of said voltage boosting means, said second enhancement-type MOS transistor being inserted between said signal input end and said first end connected to a gate of said first enhancement-type MOS transistor, the gate of said second enhancement-type MOS transistor being supplied with a predetermined bias, and said capacitor being inserted between an output of said oscillator and said first end.

7. A circuit according to claim 1, wherein said switching means comprises first, second, third and fourth enhancement-type MOS transistors, an oscillator, a capacitor and first, second and third ends, said first enhancement-type MOS transistor being inserted between said output end of said voltage retaining means and said output to said voltage boosting means, said capacitor having one end which is connected to an output end of said oscillator and the other end which is connected to said first end, and second enhancement-type MOS transistor being inserted between said first end and said second end connected to a gate of said first enhancement-type MOS transistor, the gate of said second enhancement-type MOS transistor being connected to said first end, the gate of said third enhancement-type MOS transistor being supplied with a predetermined bias, said third enhancement-type MOS transistor being inserted between said first end and said third end at which a voltage corresponding to said input signal is obtained, and said fourth enhancement-type MOS transistor being inserted between said second end and said third end and the gate of said fourth enhancement-type MOS transistor being supplied with a predetermined bias.

8. A logic circuit comprising:
   a plurality of voltage boosting means connected to a power source voltage, said plurality of voltage boosting means receiving a plurality of input signals and having a plurality of outputs for supplying a plurality of output signals, said plurality of voltage boosting means being constructed and arranged so that the voltage levels of said plurality of output signals are boosted above the level of said power source voltage when said plurality of input signals change to a predetermined level;

voltage retaining means having an output end for outputting an auxiliary voltage higher than said power source voltage; and a plurality of switching means connected between said output end of said voltage retaining means and said plurality of voltage boosting means, each being responsive to said boosting operation of one of said plurality of voltage boosting means to connect said auxiliary voltage to one of said plurality of outputs of said plurality of voltage boosting means.

9. A circuit according to claim 8, wherein each of said plurality of switching means comprises first, second and third depletion-type MOS transistors and a first end, said first depletion-type MOS transistor being inserted between said output end of said voltage retaining means and said first end, said second depletion-type MOS transistor being inserted between said power source voltage and said first end, said third depletion-type MOS transistor being inserted between said first end and one of said plurality of outputs of said plurality of voltage boosting means, a gate of said second depletion-type MOS transistor receiving a signal which causes said second depletion-type MOS transistor to turn off when the voltage of one of said plurality of input signals is boosted by said voltage boosting means, and gates of said first and third depletion-type MOS transistors receiving a signal which causes said first and third depletion-type MOS transistors to simultaneously turn on when the voltage of said output signal is boosted by said voltage boosting means.

10. A circuit according to claim 9, wherein said second depletion-type MOS transistor has a transconductance gm which is sufficiently greater than a transconductance gm of said third depletion-type MOS transistor.

11. A circuit according to claim 8, wherein each of said switching means comprises first and second enhancement-type MOS transistors, an oscillator, a capacitor and a first end, said first enhancement-type MOS transistor being inserted between said output end of said voltage retaining means and one of said plurality of output ends of said plurality of voltage boosting means, said second enhancement-type MOS transistor being inserted between one of said plurality of input signals and said first end connected to a gate of said first enhancement-type MOS transistor, the gate of said second enhancement-type MOS transistor being supplied with a predetermined bias, and said capacitor being inserted between an output end of said oscillator and said first end.

12. A circuit according to claim 8, wherein each of said switching means comprises first, second, third and fourth enhancement-type MOS transistors, an oscillator, a capacitor and first, second and third ends, said first enhancement-type MOS transistor being inserted between said output end of said voltage retaining means and one of said plurality of outputs of said plurality of voltage boosting means, said capacitor having one end which is connected to an output end of said oscillator and the other end which is connected to said first end, said second enhancement-type MOS transistor being inserted between said first end and said second end connected to a gate of said first enhancement-type MOS transistor, the gate of said second enhancement-type MOS transistor being connected to said first end, said third enhancement-type MOS transistor being inserted between said first end and said third end at which a voltage corresponding to said input signal is obtained, the gate of said third enhancement-type MOS transistor being supplied with a predetermined bias, and said fourth enhancement-type MOS transistor being inserted between said second end and said third end, the gate of said fourth enhancement-type MOS transistor being supplied with a predetermined bias.

13. A logic circuit comprising:

voltage boosting means connected to a power source voltage, said voltage boosting means receiving an input signal and having an output for supplying an output signal and having an internal boosted voltage end for obtaining an internal boosted voltage, said voltage boosting means being constructed and arranged so that the voltage level of said internal boosted voltage is boosted above the level of said power source voltage when said input signal changes to a predetermined level and so that the voltage level of said output signal is boosted above the level of said power source voltage when said internal boosted voltage is boosted;

voltage retaining means having an output end for outputting an auxiliary voltage higher than said power source voltage; and switching means connected between said output end of said voltage retaining means and said voltage boosting means and being responsive to said boosting operation of said voltage boosting means to connect said auxiliary voltage to said output of said voltage boosting means.

14. A circuit according to claim 13, wherein said voltage retaining means has a first output end and a second output end to respectively steadily produce first and second auxiliary voltages higher than said power source voltage and said switching means comprises first, second and third depletion-type MOS transistors and a first end, said first depletion-type MOS transistor being inserted between said first output end of said voltage retaining means and said first end, said second depletion-type MOS transistor being inserted between said power source voltage and said first end, said third depletion-type MOS transistor being inserted between said first end and said internal boosted voltage end, a gate of said second depletion-type MOS transistor receiving a signal which causes said second depletion-type MOS transistor to turn off when the voltage level of said output signal is boosted by said voltage boosting means, and gates of said first and third depletion-type MOS transistors receiving a signal which causes said first and third depletion-type MOS transistors to simultaneously turn on when the voltage level of said output signal is boosted by said voltage boosting means.

15. A circuit according to claim 14, wherein said second depletion-type MOS transistor has a transconductance gm which is sufficiently greater than a transconductance gm of said third depletion-type MOS transistor.

16. A circuit according to claim 13, wherein said voltage retaining means has a first output end and a second output end to respectively steadily produce first and second auxiliary voltages higher than said power source voltage and said voltage boosting means comprises first, second and third MOS transistors, an inverter and a capacitor, said first MOS transistor being inserted between said second output end of said voltage retaining means and said output end of said voltage boosting means, a gate of said first MOS transistor being connected to said internal boosted voltage end, said inverter being connected to invert said input signal, said second MOS transistor being inserted between said output of said voltage boosting means and ground, a gate of said second MOS transistor being connected to an output end of said inverter, said third MOS transistor being inserted between said input signal and said internal boosted voltage end, the gate of said third MOS transistor being connected to said output end of said inverter, and said capacitor being connected between the gate of said first MOS transistor and said outputs of said voltage boosting means.

17. A circuit according to claim 16, wherein said first and second MOS transistors are of an enhancement type.

18. A logic circuit comprising:
voltage boosting means connected to a power source voltage, said voltage boosting means receiving an input signal and having an output for supplying an output signal and having an internal boosted voltage end for obtaining an internal boosted voltage, said voltage boosting means being constructed and arranged so that the voltage level of said internal boosted voltage is boosted above the level of said power source voltage when said input signal changes to a predetermined level and so that the voltage level of said output signal is boosted above the level of said power source voltage when said internal boosted voltage is boosted;
voltage retaining means having an output end, coupled to the output of said voltage boosting means, for outputting an auxiliary voltage higher than said power source voltage; and
voltage generating means for producing said internal boosted voltage higher than said power source voltage at said internal boosted voltage end.

19. A circuit according to claim 18, wherein said voltage boosting means comprises first, second and third MOS transistors, an inverter and a capacitor, said first MOS transistor being inserted between said output end of said voltage retaining means and said output of said voltage boosting means, a gate of said first MOS transistor being connected to said internal boosted voltage end, said inverter being connected to invert said input signal, said second MOS transistor being inserted between said output of said voltage boosting means and ground, a gate of said second MOS transistor being connected to an output end of said inverter, said third MOS transistor being inserted between said input signal and said internal boosted voltage end, the gate of said third MOS transistor being supplied with a predetermined bias, and said capacitor being connected between the gate of said first MOS transistor and said output of said voltage boosting means.

20. A circuit according to claim 19, wherein said first and second MOS transistors are of an enhancement type.

21. A logic circuit comprising:
a plurality of voltage boosting means connected to a power source voltage, said plurality of voltage boosting means receiving a plurality of input signals and having a plurality of outputs for supplying a plurality of output signals and having a plurality of internal boosted voltage ends for obtaining a plurality of internal boosted voltages, said plurality of voltage boosting means being constructed and arranged so that the voltage levels of said plurality of internal boosted voltages are boosted above the level of said power source voltage when said plurality of input signals change to a predetermined level and so that the voltage levels of said plurality of output signals are boosted above the level of said power source voltage when said plurality of internal voltages are boosted;
voltage retaining means having an output end for outputting an auxiliary voltage higher than said power source voltage; and
a plurality of switching means respectively arranged between said output end of said voltage retaining means and said plurality of internal boosted voltage ends, each being responsive to said boosting operation of one of said plurality of voltage boosting means to connect said auxiliary voltage to one of said plurality of outputs of said plurality of voltage boosting means.

* * * * *